United States Patent
Ogawa et al.

(10) Patent No.: US 9,801,283 B2
(45) Date of Patent: Oct. 24, 2017

(54) METHOD OF PRODUCING ELECTRONIC COMPONENTS

(71) Applicant: Murata Manufacturing Co., Ltd., Nagaokakyo-shi, Kyoto-fu (JP)

(72) Inventors: Kazuto Ogawa, Nagaokakyo (JP); Takashi Watanabe, Nagaokakyo (JP); Junya Shimakawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 399 days.

(21) Appl. No.: 14/334,688

(22) Filed: Jul. 18, 2014

(65) Prior Publication Data

US 2015/0026973 A1    Jan. 29, 2015

(30) Foreign Application Priority Data

Jul. 23, 2013 (JP) .................................. 2013-152805

(51) Int. Cl.
| | | |
|---|---|---|
| *H05K 3/00* | (2006.01) | |
| *H05K 1/14* | (2006.01) | |
| *H05K 3/34* | (2006.01) | |

(52) U.S. Cl.
CPC .......... *H05K 3/0052* (2013.01); *H05K 1/141* (2013.01); *H05K 3/3442* (2013.01);
(Continued)

(58) Field of Classification Search
CPC ......... C23C 18/00; C23C 20/02; C23C 26/02; H05K 3/10; H05K 3/308; H05K 3/34;
(Continued)

(56) References Cited

U.S. PATENT DOCUMENTS 6,054,338 A * 4/2000 Lee .................. H01L 21/4853
257/E21.516
6,326,677 B1 * 12/2001 Bloom .................. H01C 1/144
257/421
(Continued)

FOREIGN PATENT DOCUMENTS

| CN | 102956353 A | 3/2013 |
|---|---|---|
| JP | 7-111380 A | 4/1995 |
| JP | 3601705 B2 * | 12/2004 |
| JP | 2005-116588 A | 4/2005 |
| JP | 2013-4881 A | 1/2013 |
| JP | 2013-38291 A | 2/2013 |
| JP | 2013-135187 A | 7/2013 |

(Continued)

OTHER PUBLICATIONS

Official Communication issued in corresponding Japanese Patent Application No. 2013-152805, mailed on May 7, 2015.

*Primary Examiner* — Carl Arbes
(74) *Attorney, Agent, or Firm* — Keating & Bennett, LLP

(57) ABSTRACT

A method of producing electronic components each including a substrate-type terminal and a device connected to the substrate-type terminal is performed such that the substrate-type terminal includes a substrate body including a rectangular or substantially rectangular first principal surface extending in first and second directions perpendicular or substantially perpendicular to each other. The device is disposed on the first principal surface. The method includes supporting a substrate that is to become an assembly in which the plurality of substrate-type terminals are arranged in a matrix using a first support member, cutting the substrate supported by the first support member into the plurality of substrate-type terminals, and mounting the device on the first principal surface of the substrate body of each of the plurality of substrate-type terminals obtained by cutting.

19 Claims, 14 Drawing Sheets

(52) U.S. Cl.
CPC ............... *H05K 2201/049* (2013.01); *H05K 2201/0909* (2013.01); *H05K 2201/09181* (2013.01); *H05K 2201/09645* (2013.01); *H05K 2201/10636* (2013.01); *H05K 2203/0191* (2013.01); *H05K 2203/1563* (2013.01); *Y02P 70/611* (2015.11); *Y10T 29/4913* (2015.01)

(58) Field of Classification Search
CPC .... H05K 1/141; H05K 3/0052; H05K 3/3442; H05K 2201/049; H05K 2201/0909; H05K 2201/09161; H05K 2201/09645; H05K 2201/10636; H05K 2203/0191; H05K 2203/1563; Y10T 29/4913; Y02P 70/611
See application file for complete search history.

(56) References Cited

U.S. PATENT DOCUMENTS

| | | | |
|---|---|---|---|
| 7,604,833 B2 * | 10/2009 | Suzuki | H01L 21/481 427/96.5 |
| 2007/0015309 A1 * | 1/2007 | Suzuki | H01L 21/481 438/106 |
| 2012/0326334 A1 | 12/2012 | Sakaguchi | |
| 2013/0037911 A1 * | 2/2013 | Hattori | H01L 28/40 257/532 |
| 2014/0124256 A1 | 5/2014 | Hattori et al. | |

FOREIGN PATENT DOCUMENTS

| | | |
|---|---|---|
| WO | 2012/090986 A1 | 7/2012 |
| WO | 2013/008550 A1 | 1/2013 |

* cited by examiner

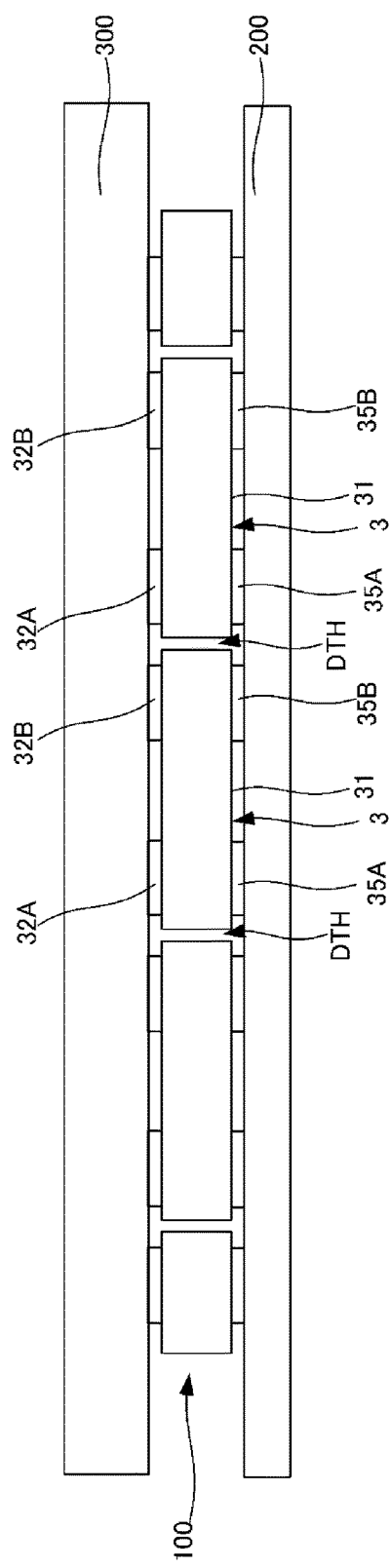
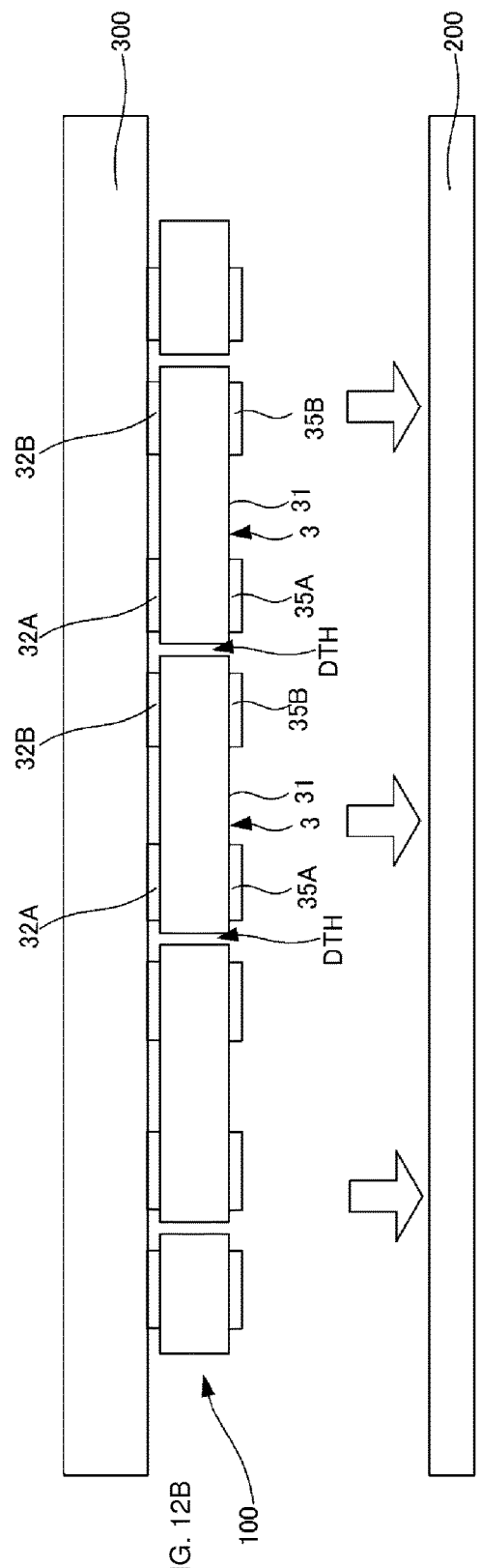
FIG. 12A
FIG. 12B

METHOD OF PRODUCING ELECTRONIC COMPONENTS

BACKGROUND OF THE INVENTION

1. Field of the Invention

The present invention relates to a method of producing electronic components each including a device and a substrate-type terminal on which the device is implemented.

2. Description of the Related Art

There is a known technique of implementing a device on a circuit board using a substrate-type terminal disposed therebetween to connect the device and a land electrode on the circuit board by wiring or prevent vibrations of the device from being transmitted to the circuit board (see, for example, Japanese Unexamined Patent Application Publication No. 2013-38291).

Japanese Unexamined Patent Application Publication No. 2013-38291 describes implementing a multilayer ceramic capacitor on an insulating substrate with a conductive pattern disposed thereon, cutting the insulating layer, and thereby extracting a chip component structure including the multilayer ceramic capacitor (device) and a substrate-type terminal.

However, in the method of producing the chip component structure described in Japanese Unexamined Patent Application Publication No. 2013-38291, impact occurring in cutting may detach the multilayer ceramic capacitor from the insulating substrate or may split the connection between the device and the insulating substrate.

SUMMARY OF THE INVENTION

Accordingly, preferred embodiments of the present invention provide a method of producing electronic components, the method being capable of reducing or preventing detachment of a device from a substrate-type terminal included in each of the electronic components and reducing or preventing splitting of the device.

According to a preferred embodiment of the present invention, a method of producing electronic components is provided. Each of the electronic components includes a substrate-type terminal and a device connected to the substrate-type terminal. The substrate-type terminal includes a substrate body having a rectangular or substantially rectangular first principal surface extending in first and second directions perpendicular or substantially perpendicular to each other. The device is disposed on the first principal surface. The method includes a supporting step of supporting a substrate that is to become an assembly in which the plurality of substrate-type terminals are arranged in a matrix using a first support member, a dividing step of cutting the substrate supported by the first support member into the plurality of substrate-type terminals, and a mounting step of mounting the device on the first principal surface of the substrate body of each of the plurality of substrate-type terminals obtained by the dividing step.

In the method of producing electronic components, the dividing step is performed while the substrate supported by the supporting step is maintained. Thus, the substrate-type terminals remain being supported, and mounting the devices is facilitated.

In the method of producing electronic components, after the dividing step of dividing the substrate into the plurality of substrate-type terminals, the mounting step of mounting the device on the first principal surface of each of the substrate-type terminals is performed. Thus, impact occurring in the dividing step does not cause detachment of the device from the substrate-type terminal and does not cause splitting of the connection between the device and the substrate-type terminal.

In the dividing step, the substrate may be cut such that the substrate-type terminals adjacent in the first direction are spaced apart at first predetermined intervals. In the mounting step, the devices may be mounted such that the devices adjacent in the first direction are spaced apart at intervals less than the first predetermined intervals.

In the dividing step, the substrate may be cut such that the substrate-type terminals adjacent in the second direction are spaced apart at second predetermined intervals. In the mounting step, the devices may be mounted such that the devices adjacent in the second direction are spaced apart at intervals less than the second predetermined intervals.

With such a producing method, the substrate-type terminal is smaller than the device as seen from the normal direction of the first principal surface of the substrate body. Accordingly, the substrate-type terminal is less susceptible to external impact. As a result, with such a method of producing electronic components, the device is prevented from being detached by receiving impact on the substrate-type terminal.

The mode may be used in which the substrate is subjected to dicer processing using a dicing blade having an edge having the same or substantially the same thickness as each of the first or second intervals to cut the substrate such that the substrate-type terminals are spaced apart at the first or second intervals. The mode may also be used in which after the substrate is pressed and cut by a cutter blade, the arrangement of the substrate-type terminals is displaced by a production tool.

The mounting step may include an applying step of applying a solder bonding agent containing tin on the first principal surface of the substrate body and a heating step of heating the substrate-type terminals and melting the solder bonding agent in a state where the devices are arranged on the first principal surface of the substrate body. The method further includes a transferring step of transferring the plurality of substrate-type terminals from the first support member to a second support member while maintaining arrangement of the plurality of substrate-type terminals, the transferring step being performed between the dividing step and the mounting step.

The second support member is not used in the dividing step, and it is not damaged by the cutting in the dividing step. Accordingly, the second support member is reusable, and thus the producing method is economical.

In the dividing step, the substrate may be cut between a plurality of electrodes configured to be connected to the devices, and the plurality of electrodes configured to be connected to the devices may be spaced apart in the first direction on the first principal surface.

In the dividing step, the substrate may be cut between a plurality of electrodes for external connection, and the plurality of electrodes for external connection may be spaced apart in the first direction on a second principal surface opposite to the first principal surface.

With such a producing method, the electrodes configured to be connected to the devices and the electrodes for external connection are not cut, and the occurrence of burrs is reliably prevented.

In the dividing step, the substrate may be cut between two connection electrodes on a side wall defined by a cylindrical or substantially cylindrical indentation extending through the substrate from electrodes configured to be connected to the devices on the first principal surface to electrodes for external connection on a second principal surface opposite to the first principal surface, the two connection electrodes connecting the electrodes configured to be connected to the devices and the electrodes for external connection at two locations spaced apart in the second direction.

In such a producing method, the connection electrodes on the side wall defined by the divided cylindrical or substantially cylindrical indentation at the time of cutting for the side surface (surface perpendicular or substantially perpendicular to the first and second principal surfaces) of the substrate-type terminal. Accordingly, with this producing method, the occurrence of burrs caused by cutting of the connection electrodes is reliably prevented.

With the above-described method, the substrate is divided before the device is implemented on the substrate-type terminal. Thus, an impact occurring in dividing does not cause detachment of the device and does not cause splitting of the connection between the device and the substrate-type terminal.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 12A and 12B are illustrations for describing a transferring process of transferring the assembly from the dicing tape to a heat-resistant adhesive plate to support the assembly.

DETAILED DESCRIPTION OF THE PREFERRED EMBODIMENTS

First Preferred Embodiment

Figure 1A:
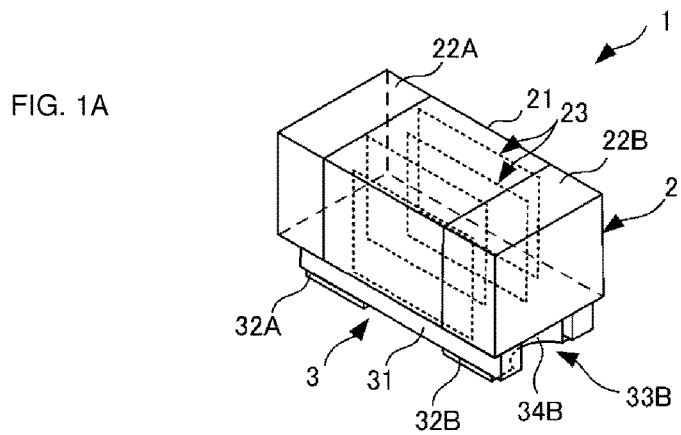
FIG. 1A is an external perspective view of an electronic component produced by a method of producing electronic components according to a first preferred embodiment of the present invention.
Figure 1B:
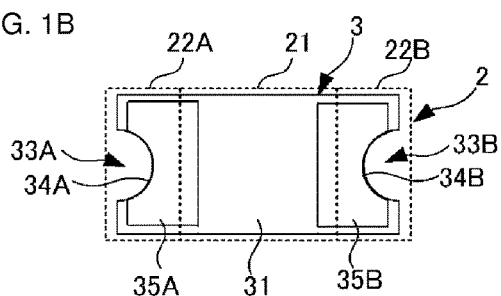
FIG. 1B is a plan view of the electronic component.
Figure 1D:
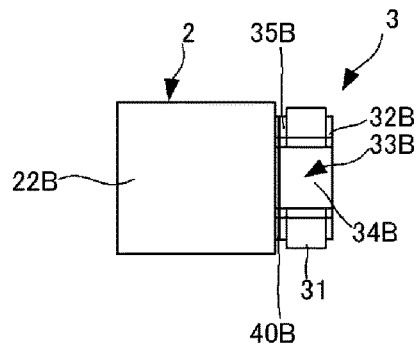
FIG. 1D is a right side view of the electronic component.
Figure 1C:
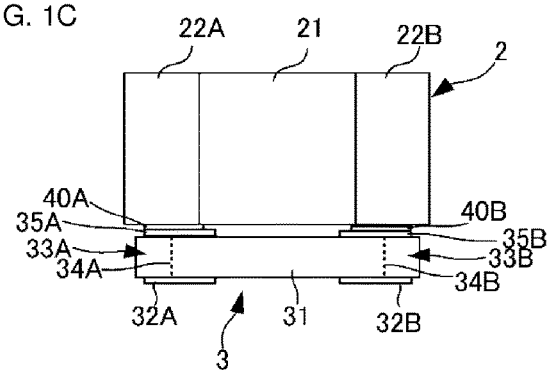
FIG. 1C is a front view of the electronic component.
Figure 1F:
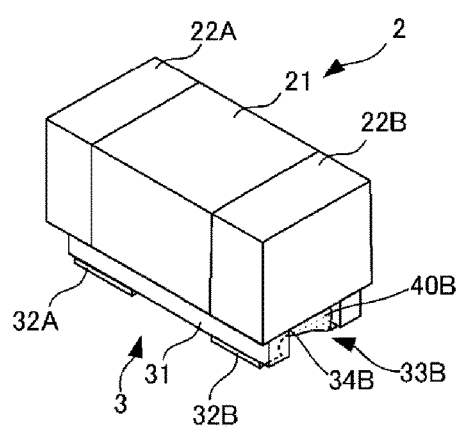
FIG. 1F is an external perspective view of the electronic component and illustrates wetting-up of a solder bonding agent.
Figure 1E:
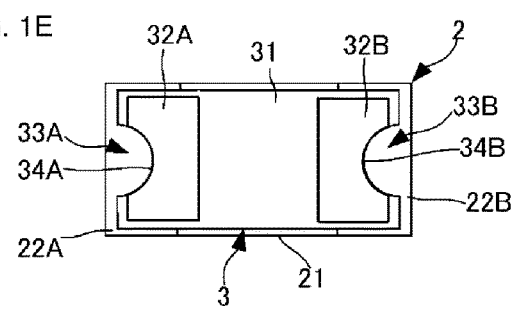
FIG. 1E is a bottom view of the electronic component.

An electronic component 1 produced by a method of producing electronic components according to a first preferred embodiment is first described with reference to FIGS. 1A to 1E. FIG. 1A is an external perspective view of the electronic component 1. FIG. 1B is a plan view of the electronic component 1. FIG. 1C is a front view of the electronic component 1. FIG. 1D is a right side view of the electronic component 1. FIG. 1E is a bottom view of the electronic component 1. FIG. 1F is an external perspective view of the electronic component 1 and illustrates wetting-up of a solder bonding agent.

As illustrated in FIG. 1A, the electronic component 1 includes a multilayer capacitor 2 and a substrate-type terminal 3.

The multilayer capacitor 2 is a so-called multilayer ceramic capacitor and includes a multilayer body 21, outer electrodes 22A and 22B, and a plurality of inner electrodes 23. The multilayer capacitor 2 is any structure in which a plurality of dielectric layers are stacked. The multilayer capacitor 2 may also be a multilayer metallized film capacitor in which a resin film is used as the dielectric material.

The multilayer body 21 has a rectangular or substantially rectangular parallelepiped shape including a first end surface (left side surface in FIG. 1A) and a second end surface (right side surface in FIG. 1A) as opposite end surfaces in the longitudinal direction. The first and second end surfaces are square or substantially square. The multilayer body 21 is the one in which a plurality of ceramic dielectric layers are laterally stacked. The multilayer body 21 also includes first and second principal surfaces and first and second side surfaces. The first and second principal surfaces are perpendicular or substantially perpendicular to the stacking direction and connected to the first and second end surfaces. The first and second side surfaces are parallel or substantially parallel to the stacking direction. The plurality of inner electrodes 23 are stacked inside the multilayer body 21 such that a dielectric layer is disposed therebetween. The first and second end surfaces of the multilayer body 21 may not be square or substantially square and may be rectangular or substantially rectangular. For example, the first and second end surfaces may be shorter in the stacking direction.

The outer electrode 22A is disposed on the first end surface (left side surface in FIG. 1A) of the multilayer body 21 and partly extends to the four surfaces connected to the first end surface of the multilayer body 21 (first and second principal surfaces and first and second side surfaces). The outer electrode 22B is disposed on the second end surface (right side surface in FIG. 1A) of the multilayer body 21 and partly extends to the four surfaces connected to the second end surface of the multilayer body 21 (first and second principal surfaces and first and second side surfaces). The outer electrodes 22A and 22B are preferably disposed on at least one of the surfaces of the multilayer body 21.

Predetermined metallic plating may be applied on the outer electrodes 22A and 22B in order to protect them from corrosion or ensure conductivity. The multilayer capacitor 2 may have popular outer dimensions. Examples of the longitudinal dimension×lateral dimension of the multilayer capacitor 2 may include approximately 3.2 mm×1.6 mm, 2.0 mm×1.25 mm, 1.6 mm×0.8 mm, 1.0 mm×0.5 mm, 0.8 mm×0.4 mm, and 0.6 mm×0.3 mm.

The electronic component 1 has the configuration in which the above-described multilayer capacitor 2 is mounted on an implementing surface of the substrate-type terminal 3. The bottom surface of the multilayer capacitor 2 mounted on the substrate-type terminal 3 facing the implementing surface of the substrate-type terminal 3 may be any one of the first and second principal surfaces and the first and second side surfaces. When the first principal surface or second principal surface of the multilayer capacitor 2 is the bottom surface facing the substrate-type terminal 3, as illustrated in FIG. 1A, the plane direction of each of the inner electrodes 23 is perpendicular or substantially perpendicular to the implementing surface of the substrate-type terminal 3. When the first side surface or second side surface of the multilayer capacitor 2 is the bottom surface facing the substrate-type terminal 3, the plane direction of the inner electrode 23 is parallel or substantially parallel with the implementing surface of the substrate-type terminal 3.

The substrate-type terminal 3 includes a substrate body 31, electrodes 35A and 35B configured to be connected to the device, electrodes 32A and 32B for external connection, and indentations 33A and 33B. The substrate body 31 has a rectangular or substantially rectangular parallelepiped shape whose thickness in a substrate normal direction perpendicular or substantially perpendicular to the implementing surface preferably is in the range of about 0.05 mm to about 0.4 mm, for example. The substrate body 31 includes a first principal surface perpendicular or substantially perpendicular to the substrate normal direction and a second principal surface opposite to the first principal surface. The multilayer capacitor 2 is mounted on the first principal surface of the substrate body 31. That is, the first principal surface of the substrate body 31 is the implementing surface of the substrate-type terminal 3. The electrodes 35A and 35B configured to be connected to the device are disposed on the first principal surface of the substrate body 31. The electrodes 32A and 32B for external connection are disposed on the second principal surface of the substrate body 31.

The substrate body 31 includes first and second end surfaces perpendicular or substantially perpendicular to the first and second principal surfaces of the substrate body 31 and extending along the lateral direction of the substrate body 31. The substrate body 31 includes first and second side surfaces perpendicular or substantially perpendicular to the first and second principal surfaces of the substrate body 31 and extending along the longitudinal direction of the substrate body 31. The substrate body 31 is rectangular or substantially rectangular as seen from the substrate normal direction. Here, the plane shape of the substrate body 31 is slightly smaller than that of the multilayer capacitor 2. For example, the plane dimensions of the substrate body 31 may be about 0.9 times those of the multilayer capacitor 2. For the outer dimensions of the substrate body 31, in consideration of attitude stability of the electronic component 1, the longitudinal dimension of the substrate body 31 may preferably be about 0.8 times or more longitudinal dimension (L) of the multilayer capacitor 2 and may more preferably be about 0.9 times or more, for example. The lateral dimension of the substrate body 31 may preferably be about 0.8 times or more lateral dimension (W) of the multilayer capacitor 2 and may more preferably be about 0.9 times or more, for example.

The indentations 33A and 33B are provided in the first and second end surfaces of the substrate body 31, respectively. The indentations 33A and 33B extend from the first principal surface to the second principal surface through the substrate body 31. The indentations 33A and 33B are semicircular or substantially semicircular as seen from the normal direction of the substrate body 31. The indentation 33A may extend from the first end surface to the first side surface or the second side surface. The indentation 33B may extend from the second end surface to the first side surface or the second side surface. The indentations 33A and 33B may not be semicircular or substantially semicircular as seen from the normal direction of the first principal surface of the substrate body 31.

The electrodes 35A and 35B configured to be connected to the device are arranged along the longitudinal direction on the first principal surface of the substrate body 31. The electrode 35A configured to be connected to the device is disposed on the first principal surface and near the first end surface of the substrate body 31. The electrode 35A configured to be connected to the device includes a cut defined by the semicircular or substantially semicircular indentation 33A in the portion near the first end surface. The electrode 35B configured to be connected to the device is disposed on the first principal surface and near the second end surface of the substrate body 31. The electrode 35B configured to be connected to the device includes a cut defined by the semicircular or substantially semicircular indentation 33B in the portion near the second end surface. These electrodes 35A and 35B configured to be connected to the device are electrically and mechanically joined to the outer electrodes 22A and 22B of the multilayer capacitor 2 with solder portions 40A and 40B disposed therebetween.

In the substrate body 31, each of the electrodes 35A and 35B configured to be connected to the device is spaced apart by about 30 μm, for example, from the corresponding side surface (surface opposite to the implementing surface and in which the indentation 33A or 33B is formed) as seen from the normal direction of the first principal surface. As the distance between each of the electrodes 35A and 35B configured to be connected to the device and the corresponding side surface of the substrate body 31 becomes shorter, the area of the electrodes 35A and 35B configured to be connected to the device on the first principal surface of the substrate body 31 becomes larger. Thus, when the distance between each of the electrodes 35A and 35B configured to be connected to the device and the corresponding side surface of the substrate body 31 is reduced, even if the area of the first principal surface of the substrate body 31 is reduced, that is, even if the implementing are of the substrate-type terminal 3 is reduced, the mounting of the multilayer capacitor 2 is stabilized. The distance between each of the electrodes 35A and 35B configured to be connected to the device and the corresponding side surface of the substrate body may preferably be about 50 μm or less, for example. The electrodes 35A and 35B configured to be connected to the device may be flush with the side surfaces of the substrate body 31.

The electrodes 32A and 32B for external connection are arranged along the longitudinal direction on the second principal surface of the substrate body 31. The electrode 32A for external connection is disposed on the second principal surface and near the first end surface of the substrate body 31. The electrode 32A for external connection includes a cut defined by the semicircular or substantially semicircular indentation 33A in the portion near the first end surface. The electrode 32B for external connection is disposed on the second principal surface and near the second end surface of the substrate body 31. The electrode 32B for external connection includes a cut defined by the semicircular or substantially semicircular indentation 33B in the portion near the second end surface. The shape of each of the electrodes 32A and 32B for external connection may be set in accordance with a mounting land of a circuit board on which the electronic component 1 is to be implemented.

Connection electrodes 34A and 34B are disposed on a portion of the side wall of the indentations 33A and 33B in the substrate body 31. The connection electrode 34A is positioned inward from the first end surface of the substrate body 31 as seen from the normal direction of the first principal surface of the substrate body 31. The connection electrode 34B is positioned inward from the second end surface of the substrate body 31 as seen from the normal direction of the first principal surface of the substrate body 31. The connection electrode 34A enables conduction between the electrode 35A configured to be connected to the device and the electrode 32A for external connection. The connection electrode 34B enables conduction between the electrode 35B configured to be connected to the device and the electrode 32B for external connection.

With the above-described shape, as illustrated in FIG. 1F, because solder flows into the indentations 33A and 33B, even if the amount of the applied solder is excessive, the solder portions 40A and 40B do not easily wet up the outer electrodes 22A and 22B in the stacking direction of the multilayer capacitor 2. Thus, even if the multilayer capacitor 2 is vibrated by a voltage applied thereon, the vibration is not easily transmitted to a circuit board connected to the electrodes 32A and 32B for external connection, and acoustic noise does not easily occur from the circuit board.

Figure 2:
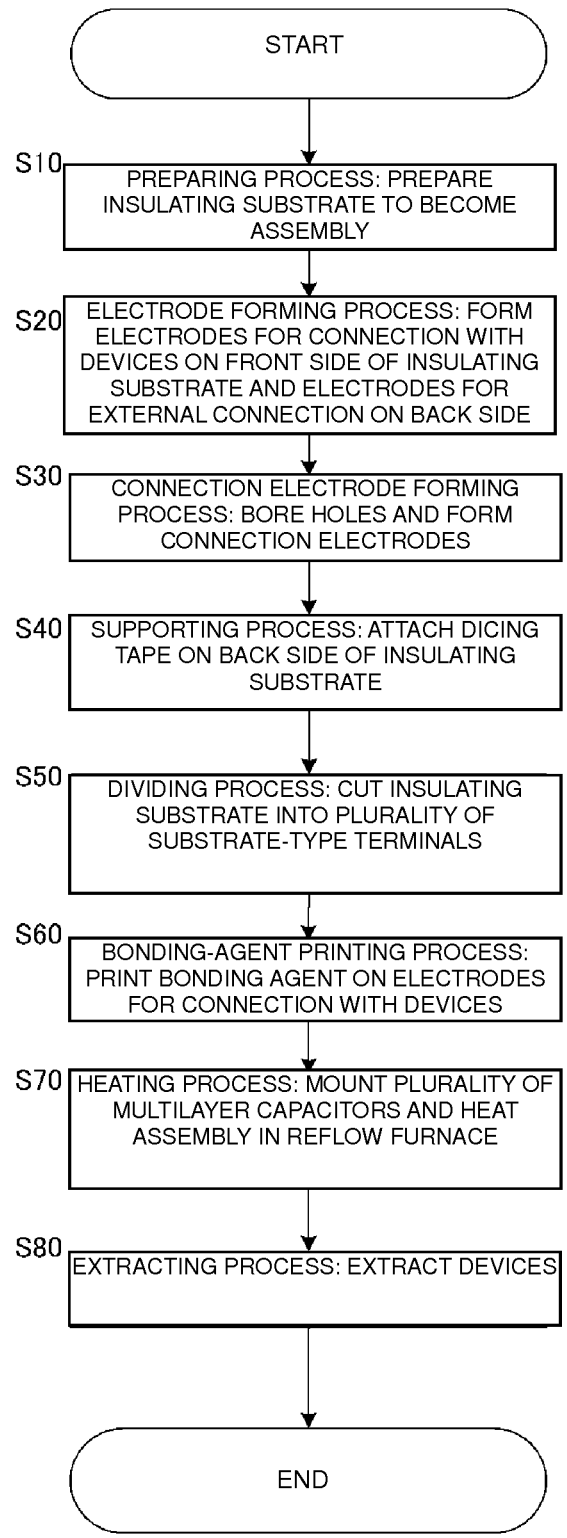
FIG. 2 is a flowchart that illustrates processes in the method of producing electronic components according to the first preferred embodiment of the present invention.
Figure 3:
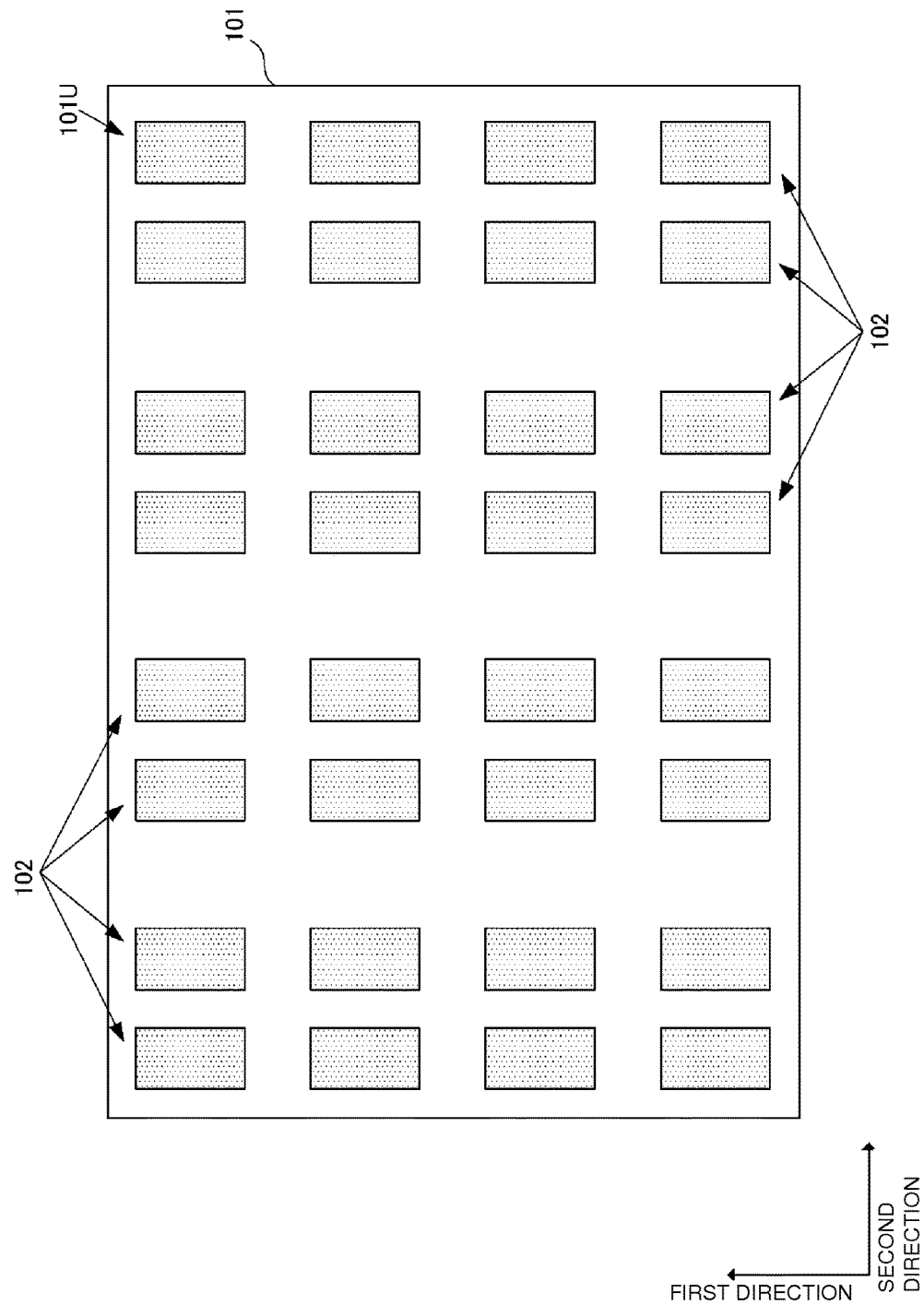
FIG. 3 is a plan view of an insulating substrate with a plurality of electrodes disposed thereon.
Figure 4:
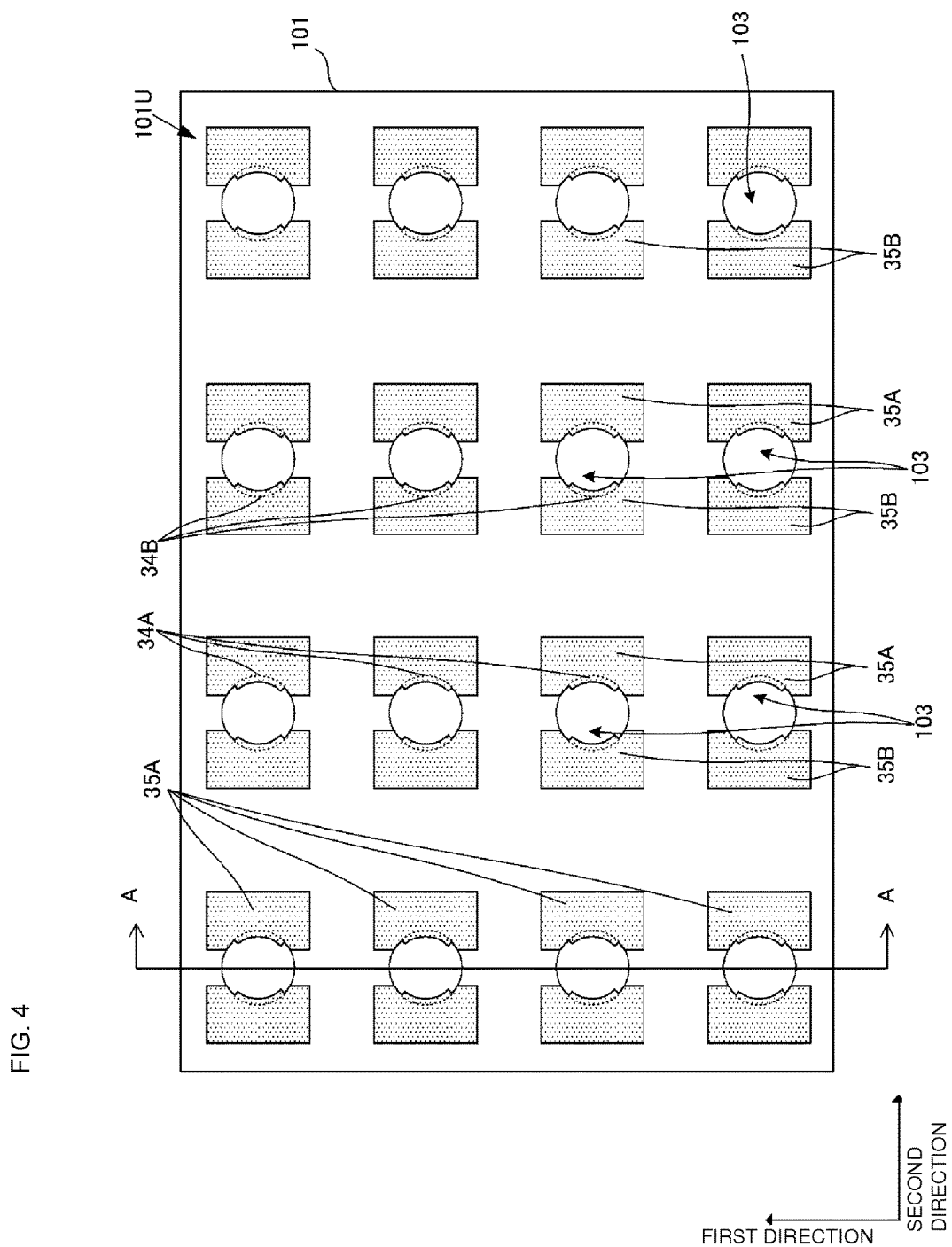
FIG. 4 is a plan view of the insulating substrate with a plurality of holes disposed therein.
Figure 5:
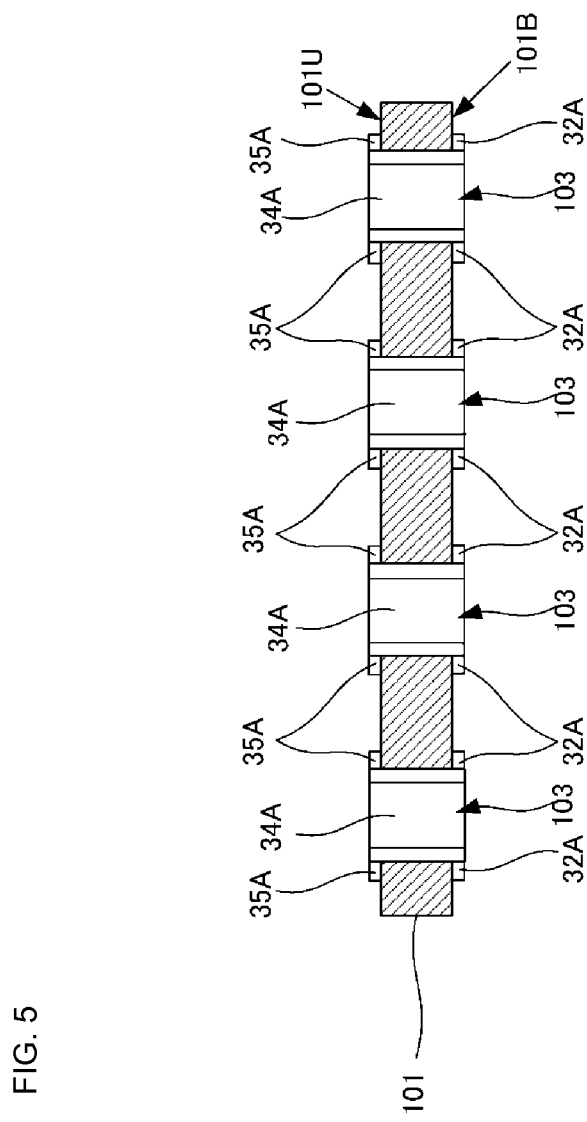
FIG. 5 is a cross-sectional view taken along the line A-A in FIG. 4 and illustrates the insulating substrate with a plurality of connection electrodes disposed thereon.
Figure 6:
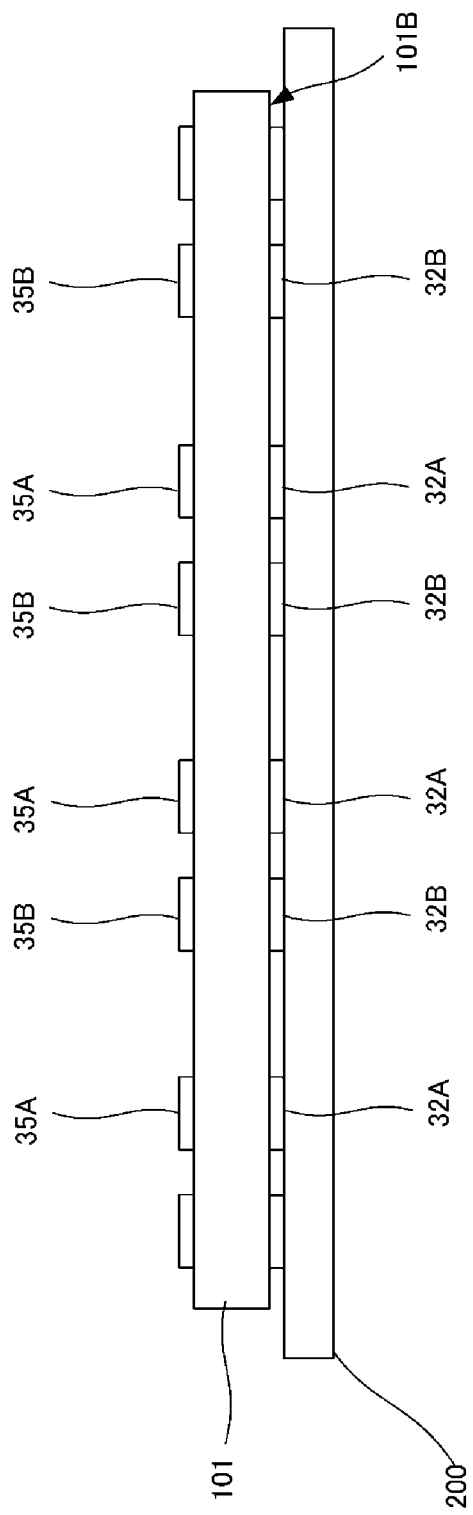
FIG. 6 is a side view of the insulating substrate supported by dicing tape from its back side.
Figure 7:
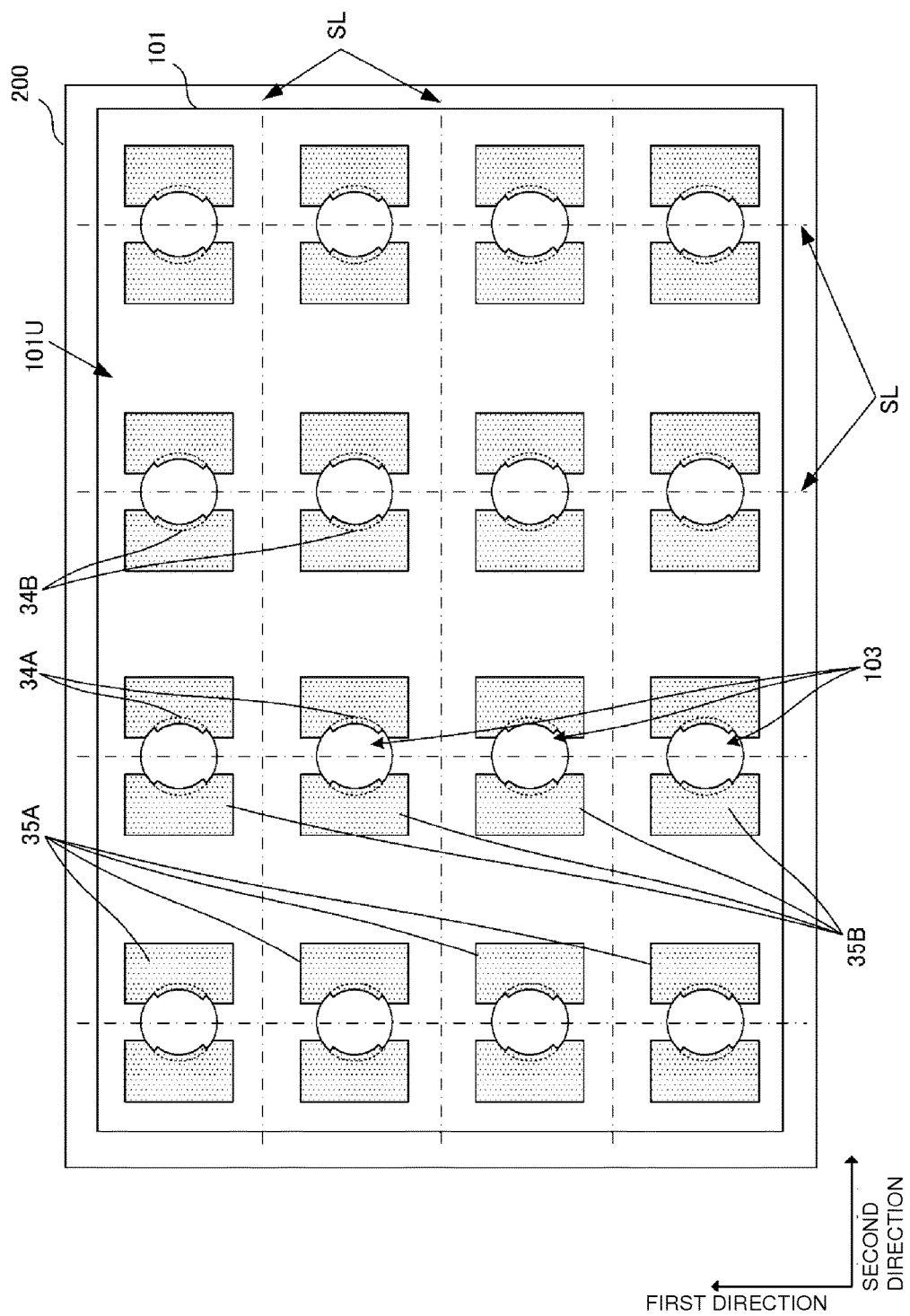
FIG. 7 is a plan view of the insulating substrate for describing separation lines.
Figure 8:
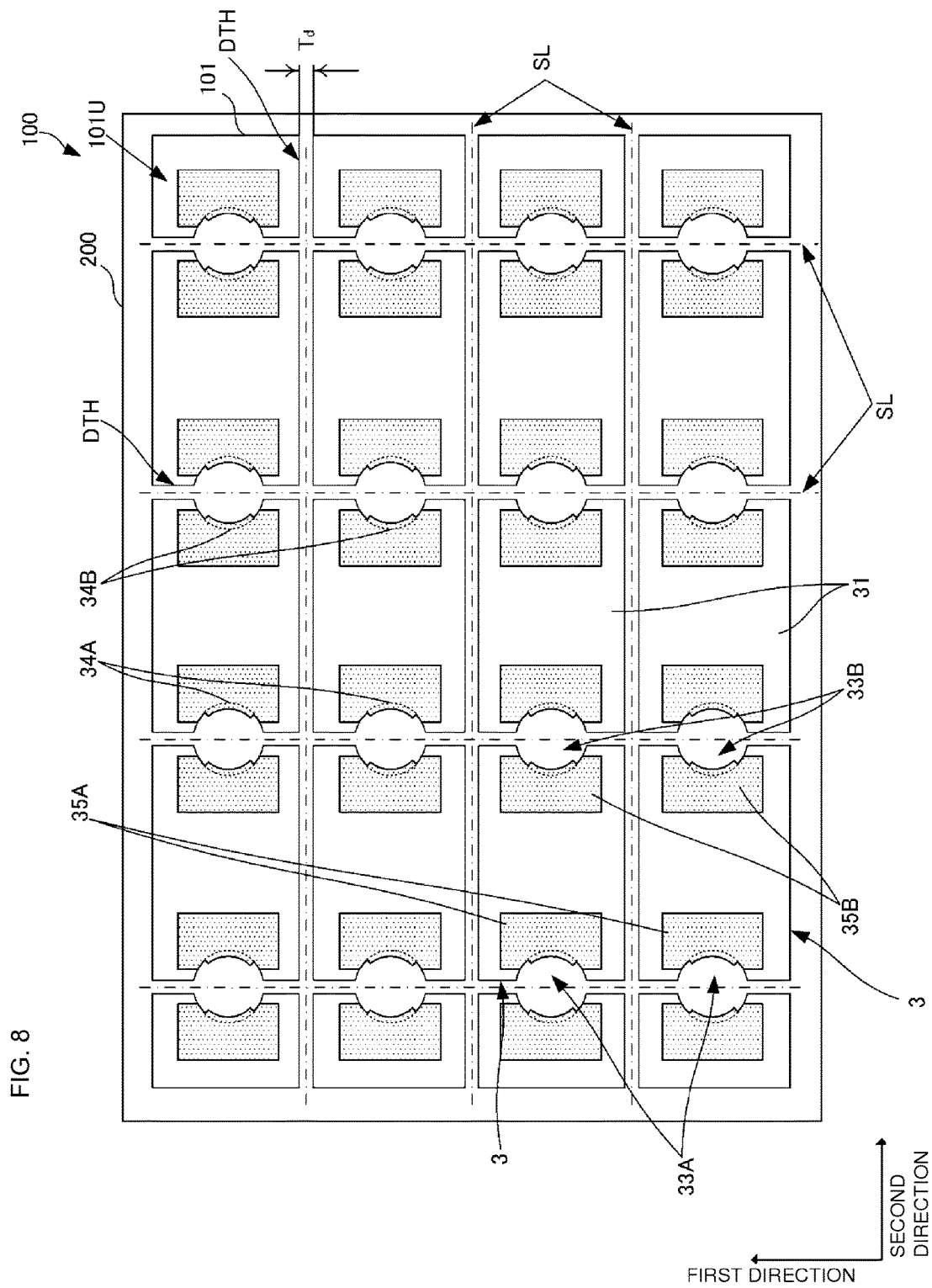
FIG. 8 is a plan view of an assembly after a dividing process.
Figure 9:
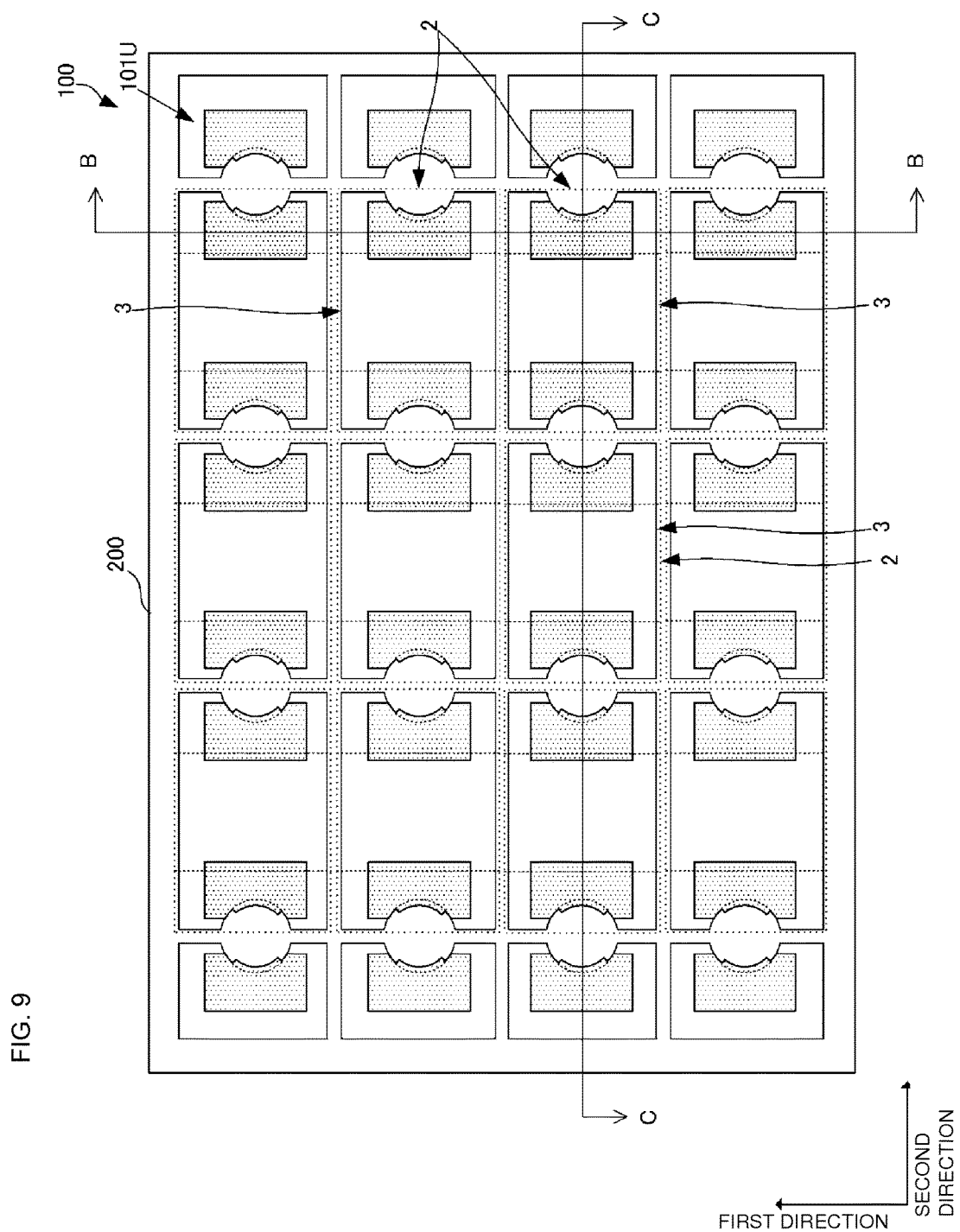
FIG. 9 is a plan view of the assembly with multilayer capacitors mounted thereon.
Figure 10A:
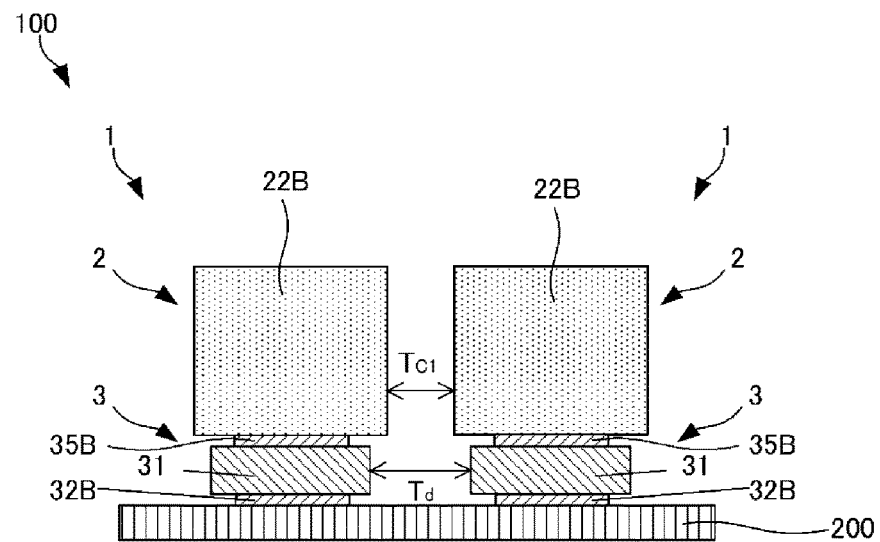
FIG. 10A illustrates a portion of a cross section taken along the line B-B in FIG. 9.
Figure 10B:
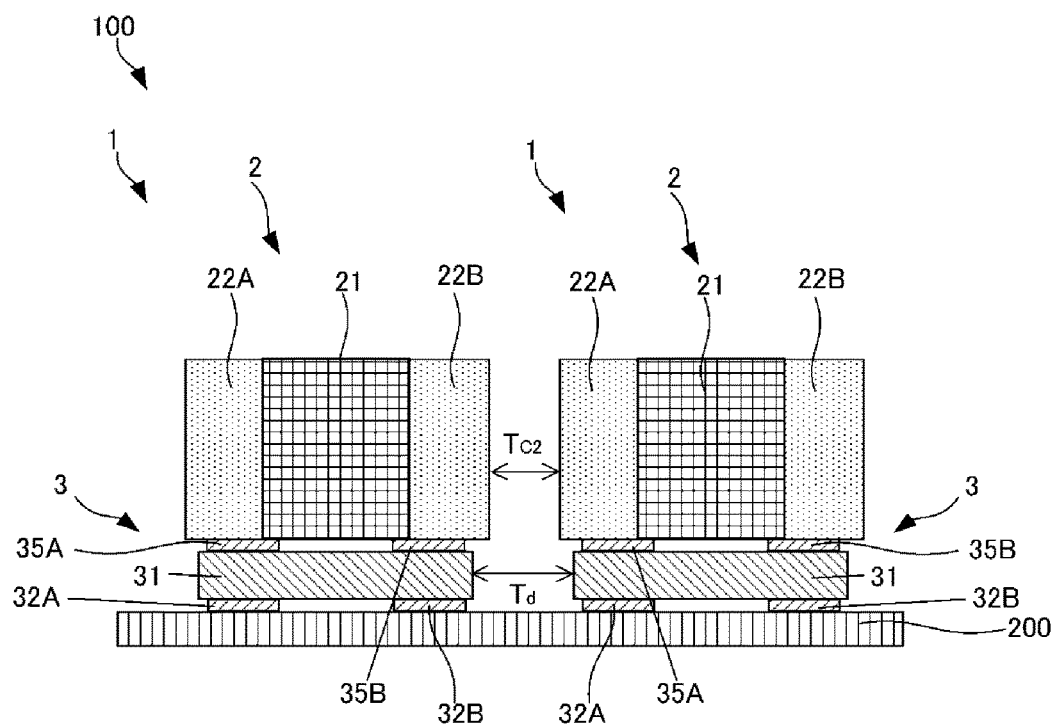
FIG. 10B illustrates a portion of a cross section taken along the line C-C in FIG. 9.

Next, a method of producing the electronic components 1 according to the first preferred embodiment is described with reference to FIGS. 2 to 10B. FIG. 2 is a flowchart that illustrates processes in the method of producing the electronic components 1 according to the first preferred embodiment. FIG. 3 is a plan view of an insulating substrate 101 with a plurality of electrodes 102 disposed thereon. FIG. 4 is a plan view of the insulating substrate 101 with a plurality of holes 103 disposed therein. FIG. 5 is a cross-sectional view taken along the line A-A in FIG. 4 and illustrates the insulating substrate 101 with the plurality of connection electrodes 34A and 34B disposed thereon. FIG. 6 is a side view of the insulating substrate 101 supported by dicing tape 200 from its back side. FIG. 7 is a plan view of the insulating substrate 101 for describing separation lines SL. FIG. 8 is a plan view of an assembly 100 after a dividing process. FIG. 9 is a plan view of the assembly 100 with the multilayer capacitors 2 mounted thereon. FIG. 10A illustrates a portion of a cross section taken along the line B-B in FIG. 9, and FIG. 10B illustrates a portion of a cross section taken along the line C-C in FIG. 9. In FIG. 9, the multilayer capacitors 2 are indicated by dotted lines for the sake of description.

First, as a preparing process, the insulating substrate 101 to become the assembly 100 including the plurality of substrate-type terminals 3 is prepared (S10). The insulating substrate 101 preferably has a thickness of about 0.05 mm to about 0.4 mm and preferably has a rectangular or substantially rectangular plane shape, for example. The insulating substrate 101 is made of an insulating resin, an inorganic material, or a material containing both. For example, the insulating substrate 101 may be a glass epoxy substrate in which a glass fabric is embedded with an epoxy resin. The mode of the insulating substrate 101 is not limited to the above-described one. For example, the mode may be used in which the insulating substrate 101 is formed by being embedded with a resin other than the epoxy resin, or the mode may be used in which it is made of another inorganic material. For example, a ceramic substrate may be used as the insulating substrate 101.

Next, as an electrode forming process, the plurality of electrodes 102 are formed on a front side 101U and a back side 101B of the insulating substrate 101 (S20). The electrodes 102 on the front side 101U and the electrodes 102 on the back side 101B are formed along desired electrode patterns. As illustrated in FIG. 3, the plurality of electrodes 102 are arranged in a matrix extending first and second directions perpendicular or substantially perpendicular to each other. The electrodes 102 are spaced apart at predetermined intervals in the first and second directions. The predetermined intervals are determined in consideration of the arrangement of the separation lines SL and the thickness $T_d$ of a dicing blade described below. The electrode pattern defined by the plurality of electrodes 102 may be formed with, for example, copper plating formed by electrolysis or electroless plating.

The electrode patterns on both sides of the insulating substrate 101 have the same or substantially the same shape. That is, the shape and the arrangement of the electrodes 102 on the back side 101B are the same or substantially the same as those on the front side 101U. However, the electrodes 102 on the back side 101B may have any shape in which they at least partly overlaps the electrodes 102 on the front side 101U as seen from the normal direction of the first principal surface of the insulating substrate 101 to enable them to be connected with the electrodes 102 on the front side 101U through the connection electrodes 34A and 34B described below.

When the plurality of electrodes 102 are formed on both sides of the insulating substrate 101 (S20), as a connection electrode forming process, the plurality of holes 103 are formed, and the connection electrodes 34A and 34B are formed by the application of plating on a portion of the holes 103 (S30). As illustrated in FIG. 4, each of the holes 103 is formed such that the electrodes 102 adjacent in the second direction is cut by a single circle. The hole 103 extends through the electrodes 102 and also extends from the front side 101U to the back side 101B through the insulating substrate 101. The hole 103 is formed with a laser or needle. The electrodes 102 on the front side 101U are made to be the electrodes 35A and 35B configured to be connected to the device by being cut by the hole 103. The electrodes 102 on the back side 101B are made to be the electrodes 32A and 32B for external connection by being cut by the hole 103.

A cross section of the insulating substrate 101 exposed by the hole 103 (side wall defined by the hole 103) is subjected to plating preferably formed of, for example, copper at two locations. As illustrated in FIG. 4, the plating is applied on the hole 103 at locations spaced apart in the second direction as seen from the normal direction of the first principal surface of the insulating substrate 101. As illustrated in FIG. 5, the plating is formed so as to be connected from the front side 101U to the back side 101B of the insulating substrate 101.

As illustrated in FIG. 5, when the plating is applied, a portion of the hole 103 becomes the connection electrodes 34A and 34B. The locations and arrangement of connection electrodes 34A and 34B are determined in consideration of the arrangement of the separation lines SL and the thickness $T_d$ of the dicing blade described below.

When a green resist is applied on the surface of the electrodes 102 before the formation of the hole 103, even if the electrodes 102 are cut by the formation of the hole 103, burrs do not easily occur.

When the hole 103 is formed and the connection electrodes 34A and 34B are formed (S30), as a supporting process, the dicing tape 200 (corresponding to a first support member) is attached on the back side 101B of the insulating substrate 101 (S40). The dicing tape 200 supports and fixes the insulating substrate 101. The dicing tape 200 is a flat film member including an adhesive surface. As illustrated in FIG. 6, the dicing tape 200 has a plane shape larger than that of the insulating substrate 101. The dicing tape 200 is a release foam sheet made of an adhesive resin, and its adhesion is weakened by heat. Although in FIG. 6 the dicing tape 200 is not in contact with the back side 101B of the insulating substrate, the back side 101B of the insulating substrate 101 may preferably be in contact with the dicing tape 200.

Next, when the insulating substrate 101 is supported by the dicing tape 200 (S40), as a dividing process, the insulating substrate 101 is cut into the plurality of substrate-type terminals 3 (S50).

The dividing process is performed by cutting the insulating substrate 101 along the separation lines SL. The separation lines SL are lines for use in dividing the insulating substrate 101 into the plurality of substrate-type terminals 3. As illustrated in FIG. 7, the separation lines SL are set in a matrix. More specifically, each of the separation lines SL extending along the first direction may be set so as to pass through, for example, a center or approximate center of the hole 103 and so as not to overlap the connection electrodes 34A and 34B. Each of the separation lines SL extending along the second direction may be set so as to pass through, for example, an intermediate or substantially intermediate location between the electrodes 35A and 35B configured to be connected to the devices adjacent in the first direction. The separation lines SL are designed lines, and it is not necessary to actually provide them to the insulating substrate 101.

The cutting is conducted by dicer processing using a dicing blade. The groove DTH formed by dicer processing has a width the same or substantially the same as the thickness $T_d$ of the edge of the dicing blade. The electrodes 102 to become the electrodes 35A and 35B configured to be connected to the devices are not cut by dicer processing in the electrode forming process because the electrodes 102 are spaced apart at intervals larger than the width of the groove DTH.

As illustrated in FIG. 8, the hole 103 is divided into the indentations 33A and 33B. The insulating substrate 101 becomes the assembly 100 including the plurality of substrate-type terminals 3 by the dividing process. In the assembly 100, the substrate-type terminals 3 are spaced apart at the same or substantially the same intervals as the thickness $T_d$ of the edge of the dicing blade. Because the insulating substrate 101 is supported by the dicing tape 200, the plurality of substrate-type terminals 3 in the assembly 100 do not fall to pieces. Thus, the subsequent processes are capable of being performed while the matrix arrangement remains.

When the assembly 100 including the plurality of substrate-type terminals 3 is formed (S50), as a bonding-agent printing process, a solder bonding agent is printed on the surface of each of the electrodes 35A and 35B configured to be connected to the devices (S60). The solder bonding agent is a conductive material containing tin. The solder bonding agent preferably is printed by screen printing, for example. However, the solder bonding agent may also be printed on the surface of each of the electrodes 35A and 35B configured to be connected to the devices by methods other than screen printing.

When the solder bonding agent is printed (S60), as a heating process, the multilayer capacitor 2 is mounted on each of the substrate-type terminals 3, and the assembly 100 is placed into a reflow furnace and is heated (S70). Performing the bonding-agent printing process at step S60 and the heating process at step S70 corresponds to a mounting process of mounting the multilayer capacitor 2 on the substrate-type terminal 3.

As illustrated in FIG. 9, the multilayer capacitors 2 are mounted such that the outer electrodes 22A and 22B are connected to the electrodes 35A and 35B configured to be connected to the devices, and they are heated. Then the solder bonding agent on the surface of each of the electrodes 35A and 35B configured to be connected to the devices are melted, and afterward, it is solidified by being cooled. As a result, the outer electrodes 22A and 22B are electrically and mechanically joined to the electrodes 35A and 35B configured to be connected to the devices.

As described above, because the substrate-type terminals 3 are spaced apart in the assembly 100, the multilayer capacitors 2 each having a plane shape larger than that of each of the substrate-type terminals 3 are mounted.

More specifically, in the assembly 100, as illustrated in the cross-sectional view of FIG. 10A taken along the line B-B in FIG. 9, the substrate-type terminals 3 are spaced apart by the same or substantially the same distance as the thickness $T_d$ of the edge of the dicing blade in the first direction in FIG. 9. The multilayer capacitors 2 are spaced apart by a distance $T_{c1}$ in the first direction in FIG. 9. The distance $T_{c1}$ is shorter than the distance $T_d$. As illustrated in the cross-sectional view of FIG. 10B taken along the line C-C in FIG. 9, the substrate-type terminals 3 are spaced apart by the same or substantially the same distance as the thickness $T_d$ of the edge of the dicing blade in the second direction in FIG. 9. The multilayer capacitors 2 are spaced apart by a distance $T_{c2}$ in the second direction in FIG. 9. The distance $T_{c2}$ is shorter than the distance $T_d$.

For example, the distances $T_{c1}$ and $T_{c2}$ may preferably be set at about 200 μm, and the distance $T_d$ may preferably be set at about 300 μm. The distances $T_{c1}$ and $T_{c2}$ are not limited to about 200 μm, and they may preferably be about 150 μm or more, for example. The distance $T_d$ may preferably be set at a value longer by about 50 μm or more than each of the distances $T_{c1}$ and $T_{c2}$, for example.

That is, the substrate-type terminal 3 has a plane shape smaller than that of the multilayer capacitor 2. Such a shape makes the substrate-type terminal 3 less susceptible to external impact. As a result, the multilayer capacitor 2 is not easily detached from the substrate-type terminal 3.

If it is necessary to further increase the distance $T_d$ in order to mount the multilayer capacitor 2, that is, if it is necessary to widen the intervals of the substrate-type terminals 3, the dicing tape 200 may be extended.

Lastly, as an extracting process, the plurality of substrate-type terminals 3 are extracted from the assembly 100 (S80). At this time, because the adhesion of the dicing tape 200 is weakened by heating in the reflow furnace, the substrate-type terminals 3 are easily and readily peeled from the dicing tape 200.

As described above, in the method of producing the electronic components 1 according to the first preferred embodiment, the multilayer capacitor 2 is mounted after the insulating substrate 101 is divided. That is, because the dividing process, where impact occur, is performed before the multilayer capacitor 2 is mounted, the multilayer capacitor 2 is not detached from the substrate-type terminal 3 or the connection between the multilayer capacitor 2 and the substrate-type terminal 3 is not split by the impact occurring in dividing. In particular, even if the distance between the cross section of the groove DTH (side surface of the substrate body 31) and each of the electrodes 35A and 35B configured to be connected to the devices is about 1 mm or less and thus the substrate body 31 is susceptible to impact, the method of producing the electronic components 1 according to the first preferred embodiment prevents detachment of the multilayer capacitor 2 and splitting of the connection between the multilayer capacitor 2 and the substrate-type terminal 3.

In the dividing process, the insulating substrate 101 is cut such that the electrodes 35A and 35B configured to be connected to the devices are not cut. Accordingly, there are no burrs caused by cutting of the electrodes 35A and 35B configured to be connected to the devices. Each of the electrodes 32A and 32B for external connection has the same or substantially the same shape as that of each of the electrodes 35A and 35B configured to be connected to the devices, and the arrangement of the electrodes 32A and 32B for external connection on the back side 101B is the same or substantially the same as that of the electrodes 35A and 35B configured to be connected to the devices. Accordingly, because in the dividing process, the insulating substrate 101 is also cut such that the electrodes 32A and 32B for external connection in the back side 101B are not cut, the back side 101B has no burrs caused by cutting of the electrodes 32A and 32B for external connection.

In addition, in the dividing process, the insulating substrate 101 is cut such that the connection electrodes 34A and 34B are not cut. Accordingly, there are no burrs caused by cutting of the connection electrodes 34A and 34B.

In the above-described example, the release foam tape whose adhesion is weakened by heat is used as the dicing tape 200. Adhesive tape other than the release foam tape may also be used as the dicing tape 200.

In the above-described example, the substrate-type terminals 3 in the assembly 100 are spaced apart using the thickness $T_d$ of the edge of the dicing blade. Modes other than dicer processing may also be used. For example, the mode may also be used in which after the insulating substrate 101 is cut by a cutter blade pressed down, the substrate-type terminals 3 are arranged at predetermined intervals using a production tool.

In the above-described example, the multilayer capacitor 2 is mounted on the substrate-type terminal 3 in the electronic component 1. Devices other than the multilayer capacitor 2, such as an inductor or other devices, may also be mounted.

Second Preferred Embodiment

Figure 11:
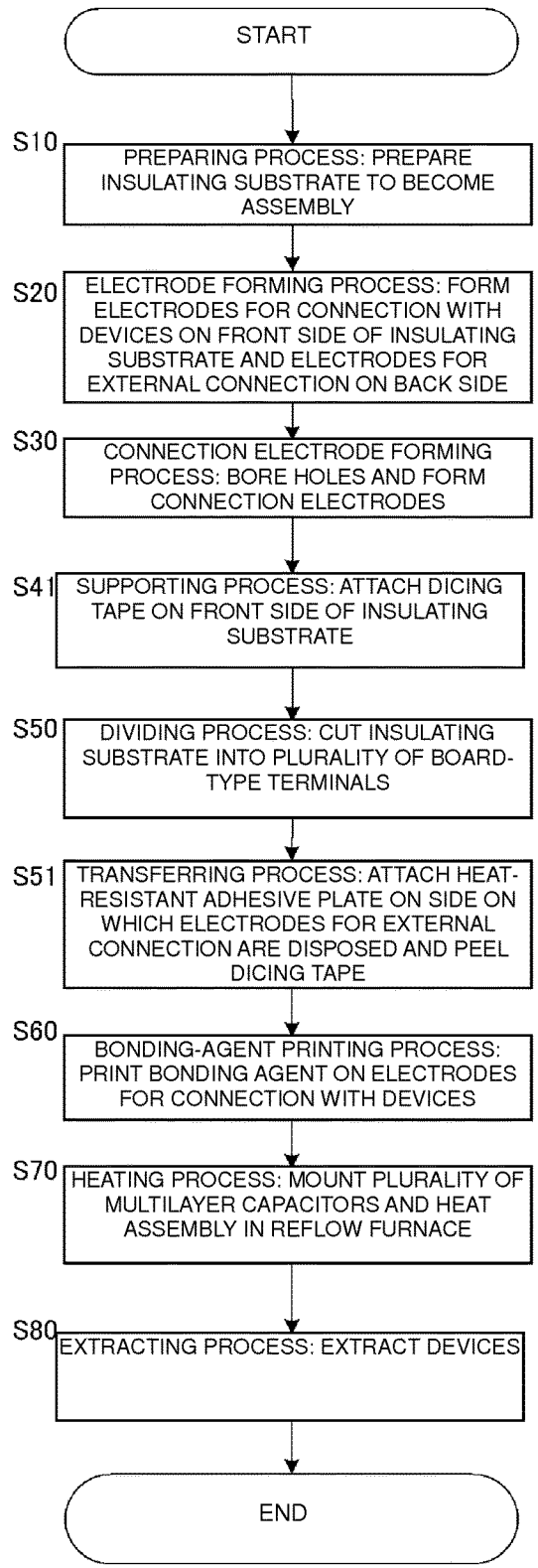
FIG. 11 is a flowchart that illustrates processes in a method of producing electronic components according to a second preferred embodiment of the present invention.

Next, a method of producing the electronic components according to a second preferred embodiment of the present invention is described with reference to FIGS. 11 to 12B. FIG. 11 is a flowchart that illustrates processes in the method of producing the electronic components 1 according to the second preferred embodiment. FIGS. 12A and 12B are illustrations for describing a transferring process of transferring the assembly 100 including the plurality of substrate-type terminals 3 from the dicing tape 200 to a heat-resistant adhesive plate 300. FIG. 12A illustrates a concept that the heat-resistant adhesive plate 300 is attached on the back side 101B of the insulating substrate 101 supported by the dicing tape 200. FIG. 12B illustrates a concept that the dicing tape 200 is peeled from the insulating substrate 101. FIGS. 12A and 12B are views of the insulating substrate 101 from the side of the insulating substrate 101.

The method of producing the electronic components 1 according to the second preferred embodiment differs from that according to the first preferred embodiment illustrated in FIG. 2 in that step S41 is performed in place of step S40 and step S51 follows step S50. That is, the method of producing the electronic components 1 according to the second preferred embodiment performs the transferring process of transferring the assembly 100 from the dicing tape 200 to the heat-resistant adhesive plate 300 to support the assembly 100. In the following description, the same processes as in the method of producing the electronic components 1 according to the first preferred embodiment are not described.

At step S41, the dicing tape 200 is made to come into contact with and be attached to the front side 101U of the insulating substrate 101.

After the dividing process illustrated in step S50, as illustrated in FIG. 12A, the heat-resistant adhesive plate 300 having adhesion not easily weakened by heat is attached on the back side (surface on which the electrodes 32A and 32B for external connection are disposed) of the assembly 100 (S51). Then the dicing tape 200 is peeled from the assembly 100 (S51), as illustrated in FIG. 12B. The dicing tape 200 is peeled off after its adhesion is weakened by heating or ultraviolet radiation. After the dicing tape 200 is peeled off, the front side (surface on which the electrodes 35A and 35B configured to be connected to the devices are disposed) of the assembly 100 is exposed, and a device mounting step of mounting the multilayer capacitors 2 on the electrodes 35A and 35B configured to be connected to the devices is allowed to be performed.

Because the heat-resistant adhesive plate 300 supports the assembly 100, even when the assembly 100 is heated in the reflow furnace, the plurality of substrate-type terminals 3 do not easily fall to pieces. The heat-resistant adhesive plate 300 is not used in dicer processing and thus is not damaged by the dicer processing. Accordingly, the heat-resistant adhesive plate 300 is reusable, and the method of producing the electronic components 1 according to the second preferred embodiment is economical.

At step S51, the dicing tape 200 having adhesion weaker than that of the heat-resistant adhesive plate 300 may be used, and the dicing tape 200 may be peeled from the assembly 100 without being heated or radiated with ultraviolet rays.

Figure 13A:
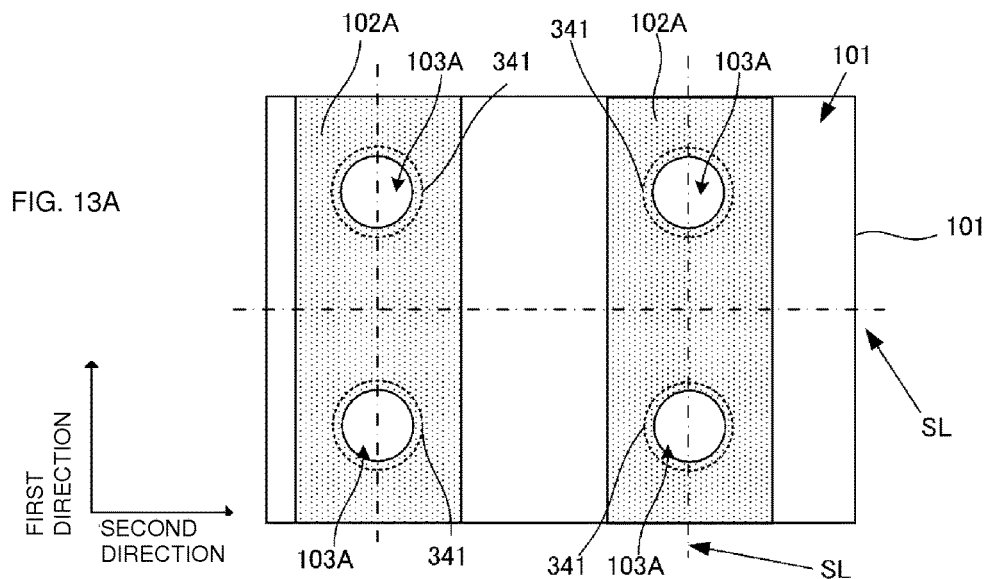
FIGS. 13A to 13C are illustrations for describing a dividing process according to a variation of a preferred embodiment of the present invention.
Figure 13B:
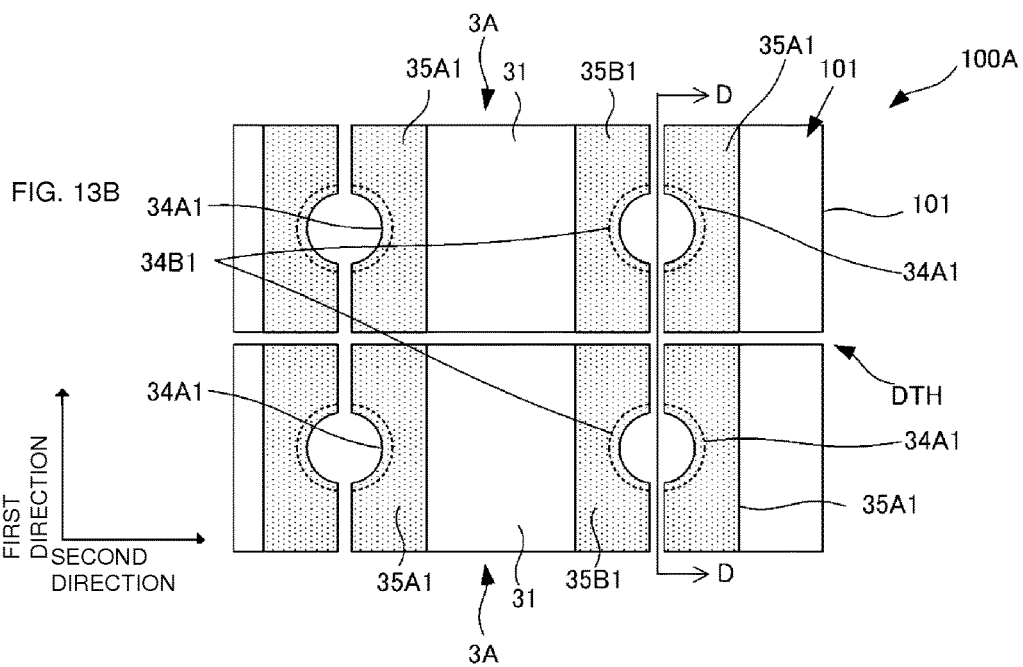
Figure 13C:
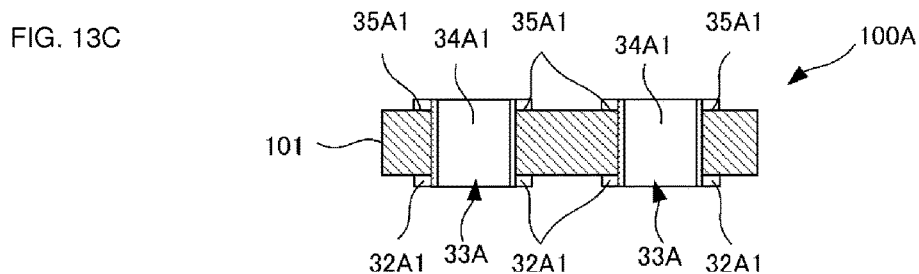

Next, the dividing process according to a variation is described with reference to FIGS. 13A to 13C. FIG. 13A illustrates a portion of a plan view of the insulating substrate 101 where a plurality of electrodes 102A, a plurality of holes 103A, and a plurality of connection electrodes 341 are disposed. FIG. 13B illustrates a portion of a plan view of an assembly 100A after the dividing process. FIG. 13C is a cross-sectional view taken along the line D-D in FIG. 13B.

A dividing process according to the variation differs from that illustrated in FIG. 8 mainly in that each of the electrodes 102A is cut into electrodes 35A1 and 35B1 configured to be connected to the devices and each of the connection electrodes 341 extending from the first principal surface to the second principal surface through the substrate body 31 is cut into connection electrodes 34A1 and 34B1. The same processes as in the dividing process illustrated in FIG. 8 are not described below.

As illustrated in FIG. 13A, each of the electrodes 102A has an elongated shape extending in the first direction on the front side 101U of the insulating substrate 101. The electrodes 102A are spaced apart at desired intervals in the second direction.

Each of the holes 103A is formed so as to extend through a single electrode 102A in a connection electrode forming process. As illustrated in FIG. 13A, each of the connection electrodes 341 is formed by the application of plating on the entire surface of a cross section (side wall defined by the hole 103A) of the insulating substrate 101 exposed by the hole 103A.

As illustrated in FIG. 13A, the separation lines SL are set so as to pass through the electrodes 102A, the holes 103A, and the connection electrodes 341.

When the cutting is performed on each of the electrodes 102A, the cut surface of the electrode 102A and the cut surface of the insulating substrate 101 are flush with each other. That is, the end surfaces (surfaces extending in the lateral direction of the substrate body 31) and the side surfaces (surfaces extending in the longitudinal direction of the substrate body 31) of the electrodes 35A1 and 35B1 configured to be connected to the device are flush with the first and second end surfaces and the first and second side surfaces of the substrate body 31, respectively, as illustrated in FIG. 13B.

When each of the connection electrodes 341 is cut, the cut surface of the connection electrode 341 and the cut surface of the insulating substrate 101 are flush with each other. That is, the end surfaces (surfaces extending in the lateral direction of the substrate body 31) of the connection electrodes 34A1 and 34B1 are flush with the first and second end surfaces of the substrate body 31, as illustrated in FIGS. 13B and 13C.

When the plurality of electrodes 102A are formed on the back side 101B in the same or substantially the same way as that on the front side 101U of the insulating substrate 101, the end surfaces (surfaces extending in the lateral direction of the substrate body 31) and the side surfaces (surfaces extending in the longitudinal direction of the substrate body 31) of electrodes 32A1 and 32B1 for external connection are flush with the first and second end surfaces and the first and second side surfaces of the substrate body 31, respectively.

When a green resist is applied on the surface of the electrode 102A before the dividing process, burrs do not easily occur when the electrode 102A is cut.

Figure 14A:
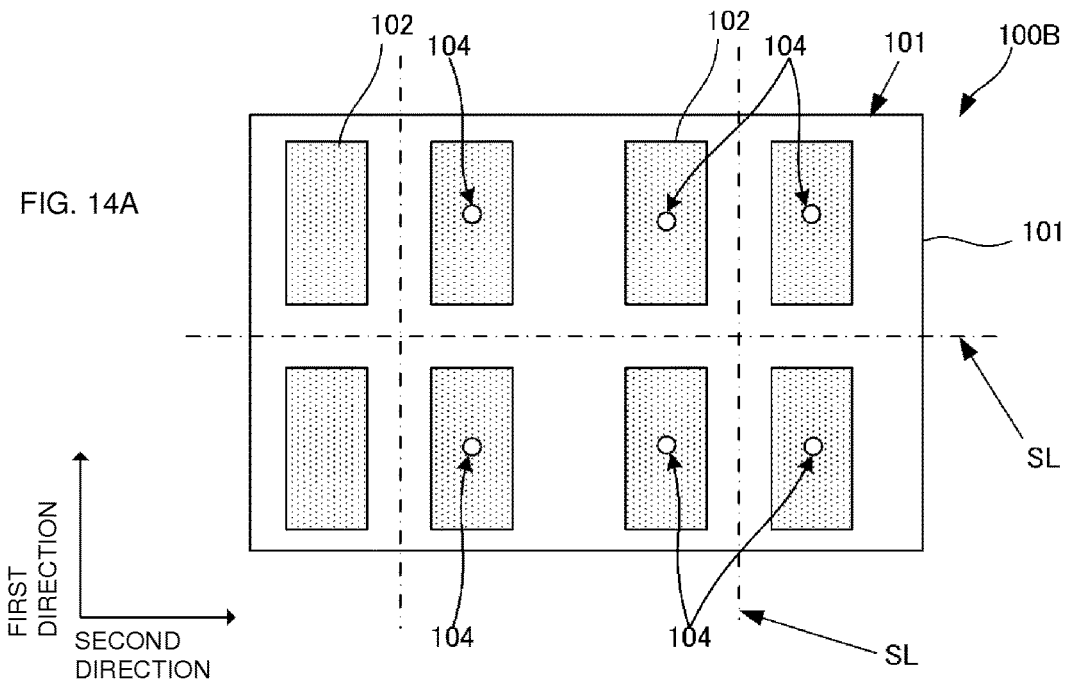
FIGS. 14A and 14B are illustrations for describing a connection electrode forming process according to the variation of a preferred embodiment of the present invention.
Figure 14B:
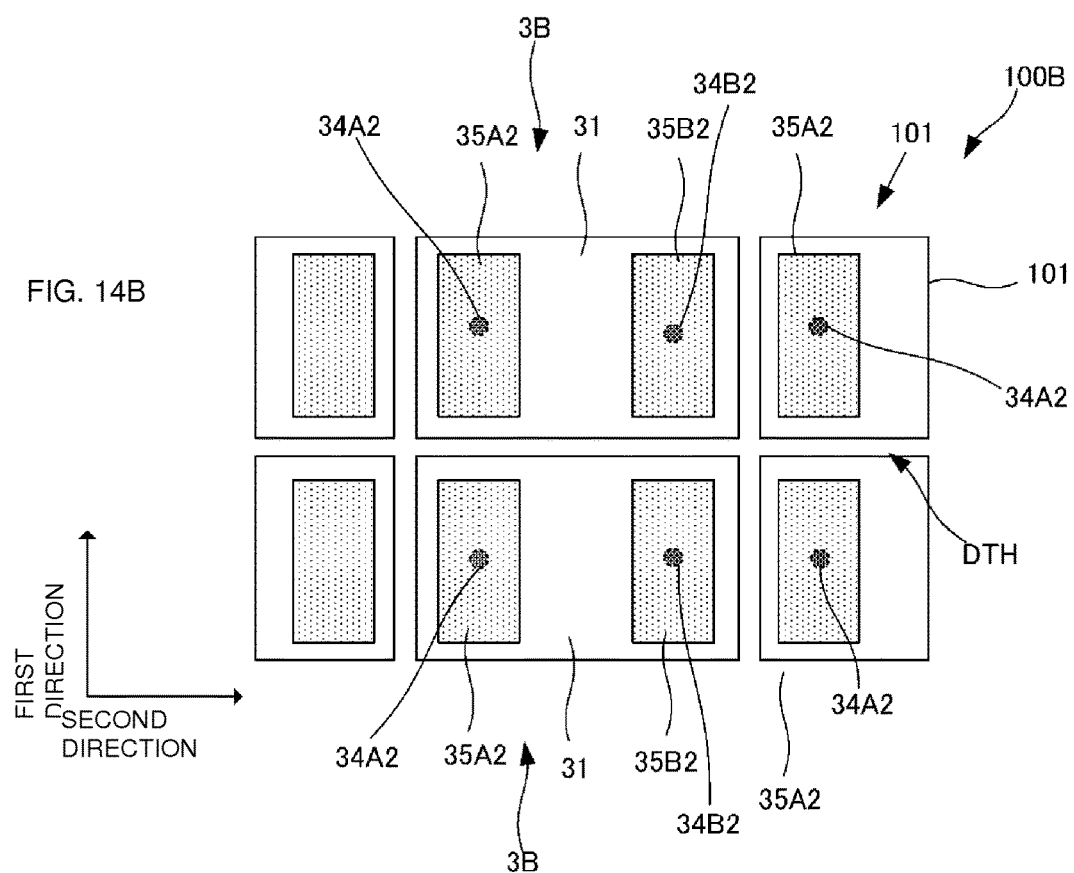

Next, a connection electrode forming process according to a variation of a preferred embodiment of the present invention is described with reference to FIGS. 14A and 14B. FIG. 14A is a plan view of the insulating substrate 101 where the plurality of electrodes 102 and the plurality of holes 104 are disposed. FIG. 14B is a plan view of an assembly 100B after the dividing process.

The connection electrode forming process according to the variation differs from that illustrated in FIGS. 4 and 5 mainly in that connection electrodes 34A2 and 34B2 are formed by producing the plurality of holes 104 and filling them with conductive paste (for example, containing silver as the main component). That is, the connection electrodes 34A2 and 34B2 are formed as vias configured to connect the electrodes 35 configured to be connected to the device and the electrodes 32 for external connection.

As illustrated in FIG. 14A, the holes 104 extend from the front side 101U to the back side 101B through the insulating substrate 101 in the respective electrodes 102. The holes 104 are filled with conductive paste. The conductive paste is sintered by the heating process, and they becomes the connection electrodes 34A2 and 34B2. The connection electrodes 34A2 and 34B2 electrically connect electrodes 35A2 and 35B2 configured to be connected to the device and electrodes 32A2 and 32B2 for external connection.

The mode may also be used in which the connection electrodes 34A2 and 34B2 are not formed as vias but are formed from through-hole plating on side walls of the holes 104.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of producing electronic components each including a substrate-type terminal and a device connected to the substrate-type terminal, the substrate-type terminal including a substrate body including a rectangular or substantially rectangular first principal surface extending in first and second directions perpendicular or substantially perpendicular to each other, the device being disposed on the first principal surface, the method comprising:
   a supporting step of supporting a substrate that is to become an assembly in which the plurality of substrate-type terminals are arranged in a matrix using a first support member;
   a dividing step of cutting the substrate supported by the first support member into the plurality of substrate-type terminals in the matrix; and
   a mounting step of mounting the device on the first principal surface of the substrate body of each of the plurality of substrate-type terminals in the matrix obtained by the dividing step; wherein
   the mounting step is performed while the plurality of substrate-type terminals are arranged in the matrix.

2. The method of producing electronic components according to claim 1, wherein
   in the dividing step, the substrate is cut such that the substrate-type terminals adjacent to each other in the first direction are spaced apart at first predetermined intervals; and
   in the mounting step, the devices are mounted such that the devices adjacent to each other in the first direction are spaced apart at intervals less than the first predetermined intervals.

3. The method of producing electronic components according to claim 1, wherein
   in the dividing step, the substrate is cut such that the substrate-type terminals adjacent to each other in the second direction are spaced apart at second predetermined intervals; and
   in the mounting step, the devices are mounted such that the devices adjacent to each other in the second direction are spaced apart at intervals less than the second predetermined intervals.

4. The method of producing electronic components according to claim 1, wherein
   the mounting step includes an applying step of applying a solder bonding agent containing tin on the first principal surface of the substrate body and a heating step of heating the substrate-type terminals and melting the solder bonding agent in a state where the devices are arranged on the first principal surface of the substrate body;

the method further comprising:

a transferring step of transferring the plurality of substrate-type terminals from the first support member to a second support member while maintaining an arrangement of the plurality of substrate-type terminals; wherein the transferring step is performed between the dividing step and the mounting step.

5. The method of producing electronic components according to claim 1, wherein in the dividing step, the substrate is cut between a plurality of electrodes configured to be connected to the devices, and the plurality of electrodes configured to be connected to the devices are spaced apart in the first direction on the first principal surface.

6. The method of producing electronic components according to claim 1, wherein in the dividing step, the substrate is cut between a plurality of electrodes for external connection, and the plurality of electrodes for external connection are spaced apart in the first direction on a second principal surface opposite to the first principal surface.

7. The method of producing electronic components according to claim 1, wherein in the dividing step, the substrate is cut between two connection electrodes on a side wall defined by an indentation extending through the substrate from electrodes configured to be connected to the devices on the first principal surface to electrodes for external connection on a second principal surface opposite to the first principal surface, the two connection electrodes connecting the electrodes configured to be connected to the devices and the electrodes for external connection at two locations spaced apart in the second direction.

8. The method according to claim 1, further comprising the step of forming outer electrodes on the substrate body and forming metallic plating on the outer electrodes.

9. The method according to claim 1, wherein the device is a capacitor.

10. The method according to claim 9, wherein a length and a width of the substrate body are respectively smaller than a length and a width of the capacitor.

11. The method according to claim 9, wherein each of the substrate-type terminals has a length and a width that are respectively smaller than a length and a width of the capacitor.

12. The method according to claim 1, wherein the device is one of a capacitor and an inductor.

13. The method according to claim 7, wherein the indentation is one of cylindrical, substantially cylindrical, semicircular and substantially semicircular as seen from a normal direction of the substrate body.

14. The method according to claim 7, wherein the indentation extends from the first principal surface to the second principal surface through the substrate body.

15. The method according to claim 5, wherein the electrodes configured to be connected to the device are cut so as to be flush with side surfaces of the substrate body.

16. The method according to claim 1, wherein the first support member is a dicing tape.

17. The method according to claim 4, wherein the second support member is a heat-resistant adhesive plate.

18. The method according to claim 4, wherein the first support member has an adhesiveness less than that of the second support member.

19. The method according to claim 7, wherein the connection electrodes are formed by forming a plurality of holes and filling the plurality of holes with conductive paste.

* * * * *